US010053797B2

United States Patent
Chuang et al.

(10) Patent No.: US 10,053,797 B2
(45) Date of Patent: Aug. 21, 2018

(54) CRYSTAL GROWTH APPARATUS AND THERMAL INSULATION COVER OF THE SAME

(71) Applicant: GLOBALWAFERS CO., LTD., Hsinchu (TW)

(72) Inventors: Lu-Chung Chuang, Hsinchu (TW); Chih-Chieh Yu, Hsinchu (TW); Wen-Chieh Lan, Hsinchu (TW); I-Ching Li, Hsinchu (TW); Wen-Ching Hsu, Hsinchu (TW); Jiunn-Yih Chyan, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 129 days.

(21) Appl. No.: 14/675,220

(22) Filed: Mar. 31, 2015

(65) Prior Publication Data

US 2015/0284876 A1    Oct. 8, 2015

(30) Foreign Application Priority Data

Apr. 3, 2014    (TW) .............................. 103205818 U

(51) Int. Cl.
*C30B 35/00*    (2006.01)
*C30B 15/10*    (2006.01)
(Continued)

(52) U.S. Cl.
CPC ............ *C30B 35/002* (2013.01); *C30B 15/10* (2013.01); *C30B 15/14* (2013.01); *C30B 35/00* (2013.01);
(Continued)

(58) Field of Classification Search
CPC ....... C30B 15/14; C30B 11/002; C30B 15/10; C30B 35/00; Y10T 117/1068
See application file for complete search history.

(56) References Cited

U.S. PATENT DOCUMENTS

| 2004/0112277 A1* | 6/2004 | Kulkarni ................. C30B 15/14 117/13 |
| 2009/0158995 A1* | 6/2009 | Lew ...................... C30B 11/002 117/200 |

(Continued)

FOREIGN PATENT DOCUMENTS

| JP | 59074180 A | * | 4/1984 | ............... C09K 3/14 |
| JP | 2000086381 A | * | 3/2000 | ............. C30B 15/00 |

(Continued)

OTHER PUBLICATIONS

European Patent Office, English computer translation of JP 2000-086381 (dated 2017).*

(Continued)

*Primary Examiner* — Matthew J Song
(74) *Attorney, Agent, or Firm* — Lynette Wylie; Apex Juris, pllc.

(57) ABSTRACT

A crystal growth apparatus includes a crucible, a heating device, a thermal insulation cover, and a driving device. The crucible contains materials to be melted, wherein the heating device heats the crucible to melt the materials; the thermal insulation cover is provided upon the materials, wherein the thermal insulation cover includes a main body, which has a bottom surface facing an interior of the crucible, and a insulating member being provided at the main body; the driving device moves the thermal insulation cover towards or away from the materials, whereby, the thermal insulation cover effectively blocks heat conduction and heat convection, which prevents thermal energy from escaping out of the crucible.

7 Claims, 5 Drawing Sheets

(51) Int. Cl.
*C30B 15/14* (2006.01)
*C30B 11/00* (2006.01)

(52) U.S. Cl.
CPC ........ *C30B 11/002* (2013.01); *Y10T 117/1068* (2015.01); *Y10T 117/1092* (2015.01)

(56) References Cited

U.S. PATENT DOCUMENTS

| | | | | |
|---|---|---|---|---|
| 2010/0064964 | A1* | 3/2010 | Hoshi | C30B 15/14 117/15 |
| 2014/0205837 | A1* | 7/2014 | Choi, II | C30B 15/22 428/399 |

FOREIGN PATENT DOCUMENTS

| JP | 2004123516 A | 4/2004 |
|---|---|---|
| JP | 2004352581 A | 12/2004 |
| JP | 2012091942 A | 5/2012 |

OTHER PUBLICATIONS

Office Action for JP2015070895, dated Mar. 22, 2016, Total of 6 pages.
English Abstract for JP2012091942, Total of 1 page.
English Abstract for JP2004123516, Total of 1 page.
English Abstract for JP2004352581, Total of 1 page.

* cited by examiner

CRYSTAL GROWTH APPARATUS AND THERMAL INSULATION COVER OF THE SAME

BACKGROUND OF THE INVENTION

1. Technical Field

The present invention relates generally to a process of producing a single crystal, and more particularly to a crystal growth apparatus and a thermal insulation cover of the crystal growth apparatus.

2. Description of Related Art

To make a single crystal, a solid material is heated and melted in a crystal growth apparatus, and then a seed crystal is immersed into the melted material to start crystal growth. A conventional crystal growth apparatus includes a crucible and a plurality of heaters, wherein the crucible is provided for holding the material to be melted, and the heaters are installed around the crucible to provide heat to melt the material in the crucible. However, thermal energy tends to escape into the open space above the crucible through an opening thereon, and therefore it would take longer time to reach the melt point of the material, and the thermal energy provided by the heaters would be wasted unnecessarily.

To overcome this defect, there have been several types of crystal growth apparatuses designed to reduce the amount of thermal energy escaping through the opening of a crucible.

For example, a crystal growth apparatus disclosed in Taiwan utility model patent NO. M424337 has a thermal insulation cover provided on a crucible, wherein a surface of the thermal insulation cover is glossy or has a mirror surface thereon to reflect thermal radiation back into the crucible, which reduces heat dissipation.

In addition, another crystal growth apparatus disclosed in Taiwan invention patent NO. I405877 has a round quartz plate which is coated with gold provided on a crucible, wherein the surface coated with gold forms a reflective structure capable of reflecting thermal radiation back into the crucible to reduce heat dissipation.

The disclosures of the aforementioned patents both reduce heat dissipation by reflecting thermal radiation back into the crucible. However, in addition to radiation, thermal energy can be also transmitted through conduction and convection. Therefore, the designs of the conventional crystal growth apparatuses still have room for improvement to further prevent thermal energy from escaping out of the crucible.

BRIEF SUMMARY OF THE INVENTION

In view of the above, the primary objective of the present invention is to provide a crystal growth apparatus and its thermal insulation cover, which effectively prevent thermal energy in a crucible from escaping.

The thermal insulation cover provided in the present invention is applicable on a crystal growth apparatus which includes a crucible for holding a material to be melted, wherein the thermal insulation cover is provided above the material to be melted. The thermal insulation cover includes a main body and an insulating member, wherein the main body has a bottom surface facing an inner bottom of the crucible; the insulating member is provided on the main body at a location opposite to the bottom surface of the main body, and is within an orthographic range of the bottom surface.

The present invention further provides a crystal growth apparatus, which includes a crucible, a thermal insulation cover, a driving device, and a heating device. The thermal insulation cover includes a main body and an insulating member, wherein the main body has a bottom surface facing an inner bottom of the crucible; the insulating member is provided on the main body at a location opposite to the bottom surface of the main body, and is within an orthographic range of the bottom surface. The driving device moves the thermal insulation cover towards or away from the crucible. The heating device heats the crucible.

With the aforementioned design, the thermal insulation cover effectively blocks heat conduction and convection, and therefore thermal energy is prevented from escaping out of the crucible.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
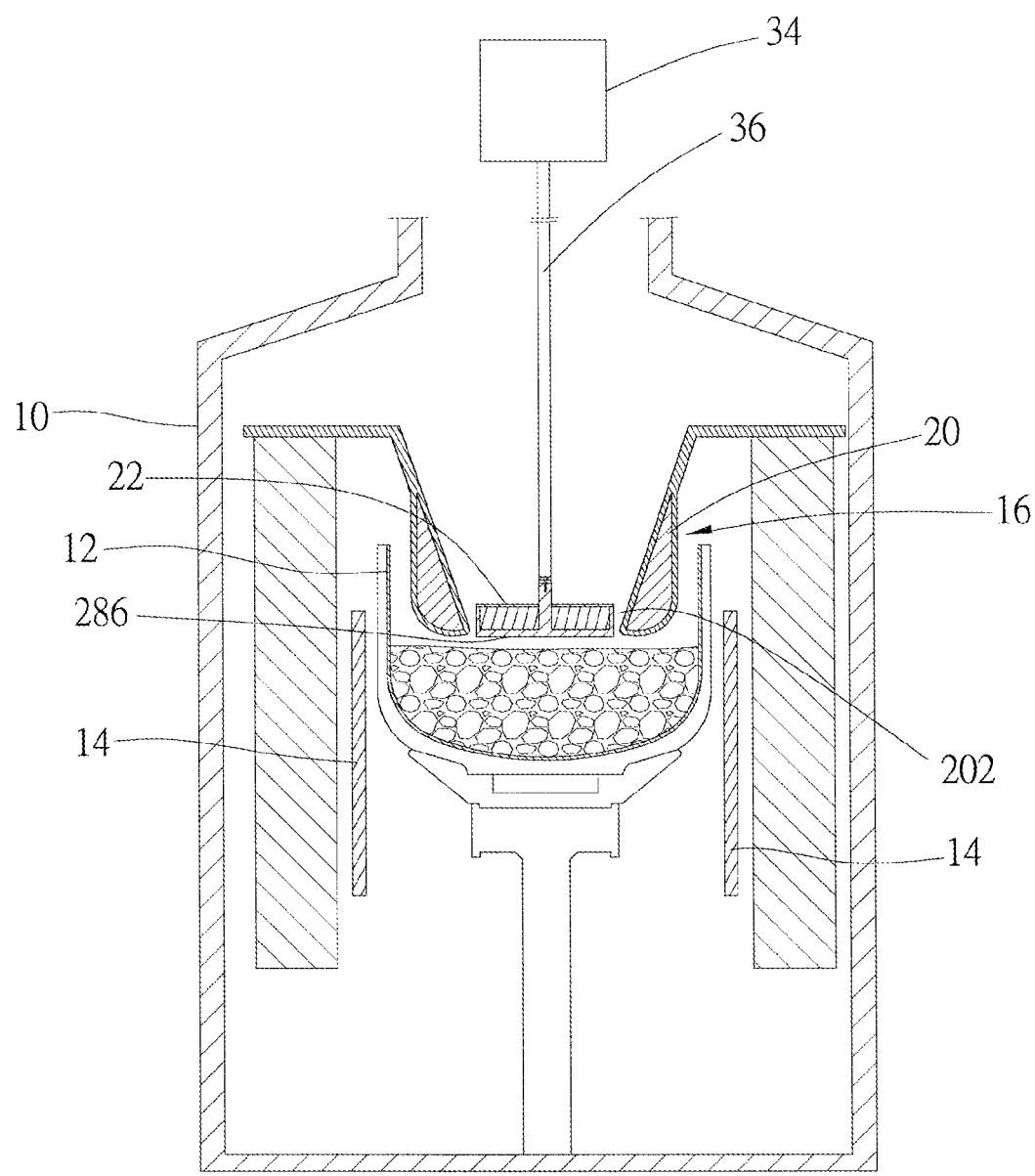
FIG. 1 is a schematic diagram of the crystal growth apparatus of a first preferred embodiment of the present invention.
Figure 2:
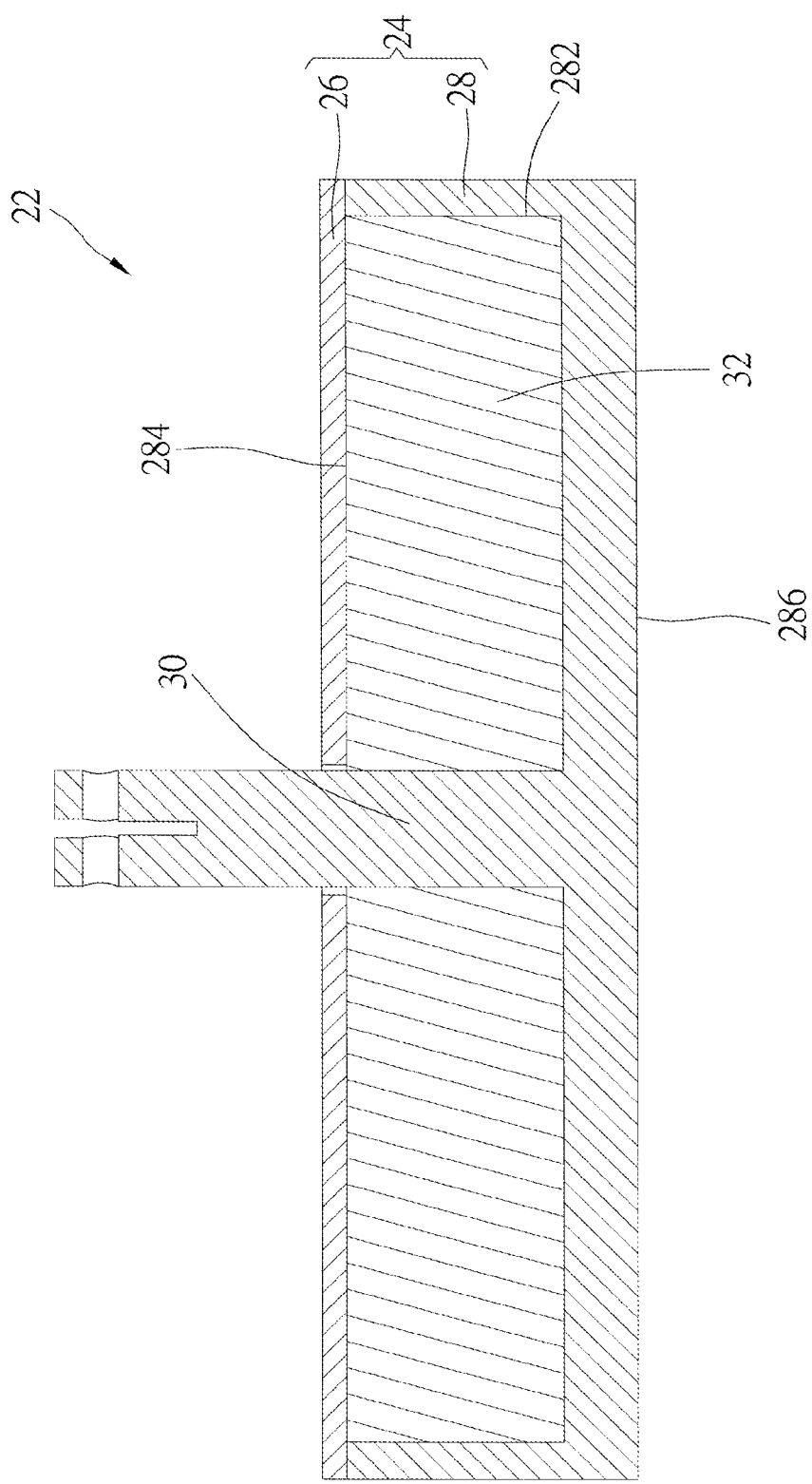
FIG. 2 is a sectional view of the thermal insulation cover of the first preferred embodiment of the present invention.

As shown in FIG. 1 and FIG. 2, a crystal growth apparatus of the first preferred embodiment of the present invention includes a furnace body 10, a crucible 12 provided in the furnace body 10, a plurality of heaters 14, a heat insulator 16, a thermal insulation cover 22, and a driving device 34.

The crucible 12 is provided for holding a material (i.e., solid silicon material) to be melted. The heaters 14 are installed around the crucible 12 to provide thermal energy to the crucible 12 to melt the material therein, wherein the heaters 14 are heating devices of the present invention. The heat insulator 16 includes a shield 20 provided on the material to be melted. After the material is melted, the shield 20 prevents part of thermal energy from escaping from the surface of the melted material. The shield 20 has a passage 202. The thermal insulation cover 22 is provided above the material to be melted, and is connected to the driving device 34 through a wire 36. With the wire 36, the driving device 34 can move the thermal insulation cover 22 downwardly into the passage 202 of the shield 20 or upwardly, away from the crucible 12.

In the first preferred embodiment, the thermal insulation cover 22 includes a main body and an insulating member 32, wherein the main body 24 is made of graphite, while the insulating member 32 is made of carbon fiber materials. In practice, the insulating member 32 can be also made of aluminum oxide fiber or zirconia fiber. The main body 24 includes a top plate 26, a base 28, and a connector 30, wherein the base 28 has a chamber 282 and a top opening 284 communicated with the chamber 282. The top plate 26 is engaged with the base 28 to seal the top opening 284. The connector 30 is engaged with an inner bottom of the base 28 and goes through the top plate 26 to connect a lower end of the wire 36. In practice, the connector 30 can be alternatively engaged with the top plate 26, which connects the thermal insulation cover 22 to the wire 36 as well.

The base 28 has a bottom surface 286 facing an inner bottom of the crucible 12, while the insulating member 32 is provided in the chamber 282, and is located within an orthographic range of the bottom surface 286. In this way, the main body 24 can firmly support the insulating member 32. An outer circumferential surface of the main body 24 and a wall of the passage 202 of the shield 20 are separated with a gap to avoid collision between the main body 24 and the shield 20, which may cause graphite dusts to fall into the crucible 12. Noble gas introduced into the furnace body 10 contacts the surface of the melted material through the gap between the main body 24 and the shield 20.

With the aforementioned design, during the process of melting the material in the crystal growth apparatus, the driving device 34 can be controlled to move the thermal insulation cover 22 into the passage 202 of the shield 20 to prevent thermal energy inside the crucible 12 from dissipating through heat convection via the passage 202 of the shield 20. On the other hand, the insulating member 32 blocks heat conduction. Whereby, the thermal insulation cover 22 is capable of blocking heat convection and heat conduction at the same time. In practice, the bottom surface 286 of the main body 24 can also have a glossy mirror surface provided thereon, or can be coated with reflective materials. In this way, the thermal insulation cover 22 not only blocks heat conduction and heat convention, but also reflects thermal radiation back into the crucible 12, and therefore provides even better heat insulation effect.

In practice, the chamber 282 of the main body 24 can be omitted, as long as the insulating member 32 is located at a location opposite to the bottom surface 286, and is within the orthographic range of the bottom surface 286, for the main body 24 can still support the insulating member 32 and prevent the material of the insulating member 32 from falling into the crucible 12 in such case.

After the material in the crucible 12 is melted into a liquid, the driving device 34 can be controlled to move the thermal insulation cover 22 upwardly to leave the crucible 12, and then the subsequent process of crystal growth can proceed. The process of crystal growth is a conventional technique, and therefore the related details are not described herein.

In addition to the structure shown in FIG. 2, the thermal insulation cover provided in the present invention can have other modifications as described below.

Figure 3:
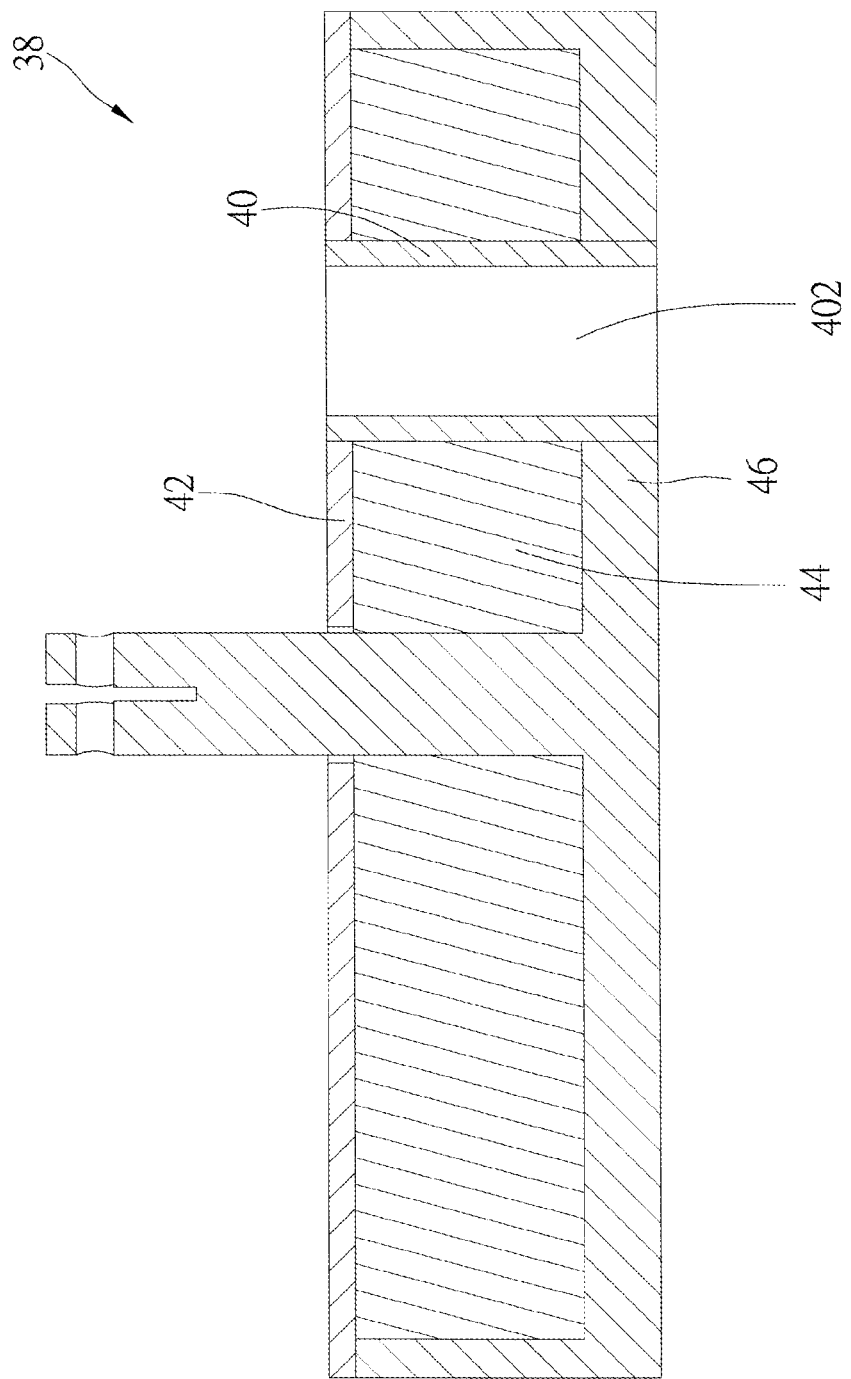
FIG. 3 is a sectional view of the thermal insulation cover of a second preferred embodiment of the present invention.

A thermal insulation cover 38 of the second preferred embodiment of the present invention is shown in FIG. 3, which has approximately the same structure with the first preferred embodiment, except that the thermal insulation cover 38 of the second preferred embodiment further includes a connecting tube 40 passing through the top plate 42, the insulating member 44, and the base 46, wherein the connecting tube 40 communicates the spaces above and below the thermal insulation cover 38. As a result, a passage 402 is formed inside the connecting tube 40, and the melting condition of the material in the crucible 12 can be monitored through the passage 402.

Figure 4:
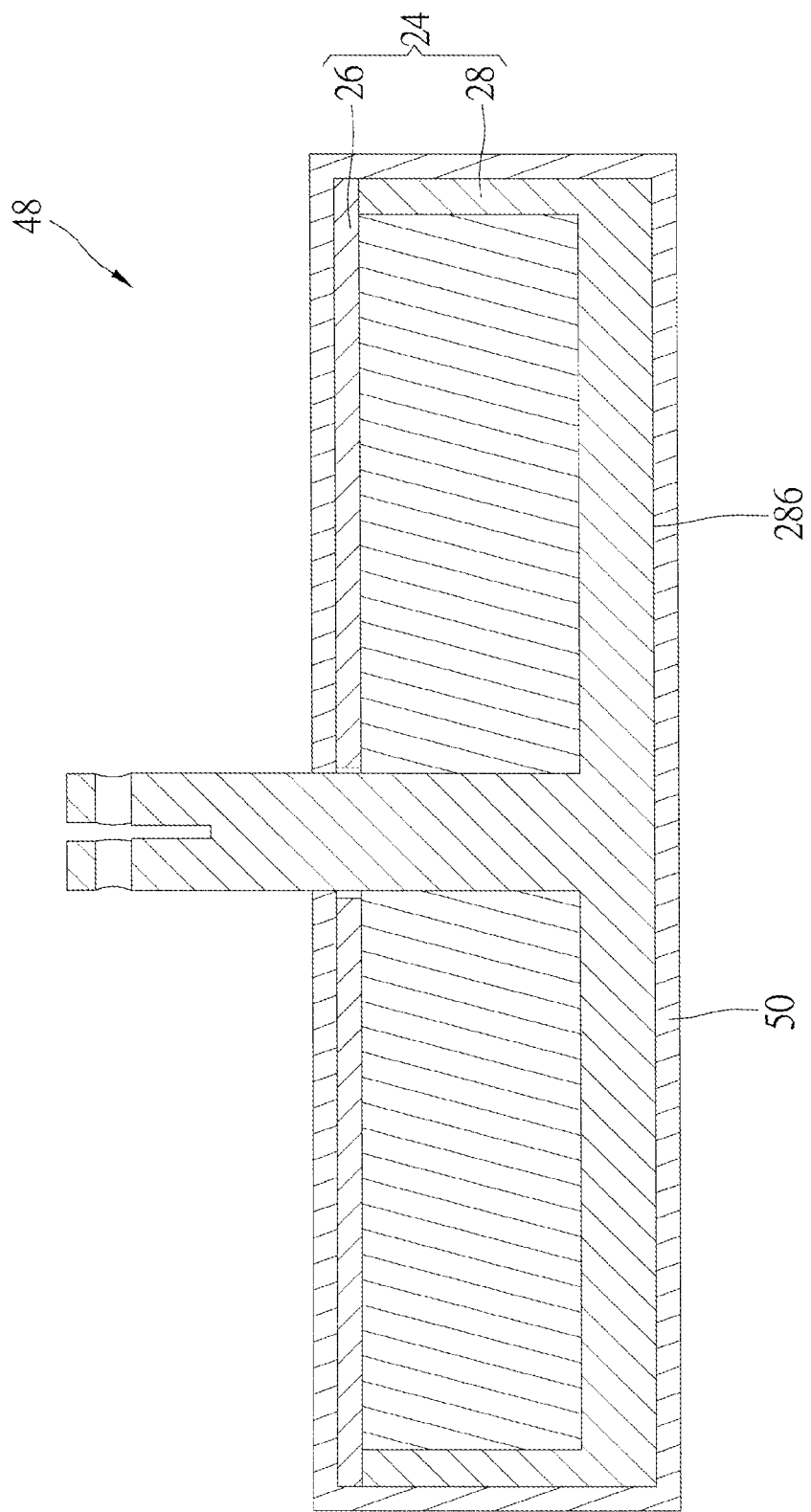
FIG. 4 is a sectional view of the thermal insulation cover of a third preferred embodiment of the present invention.

A thermal insulation cover 48 of the third preferred embodiment of the present invention is shown in FIG. 4, which is designed based on the thermal insulation cover 22 of the first preferred embodiment, and further includes a protective layer 50 covering a top surface of the top plate 26, the outer circumferential surface of the base 28, and the bottom surface 286. The protective layer 50 can be made of high density cemented carbide or Si—C layers, and is harder than the main body 24. Whereby, the protective layer 50 prevents carbon crumbs from falling into the crucible 12 when the thermal insulation cover 48 collides with the wall of the passage 202 of the shield 20.

Figure 5:
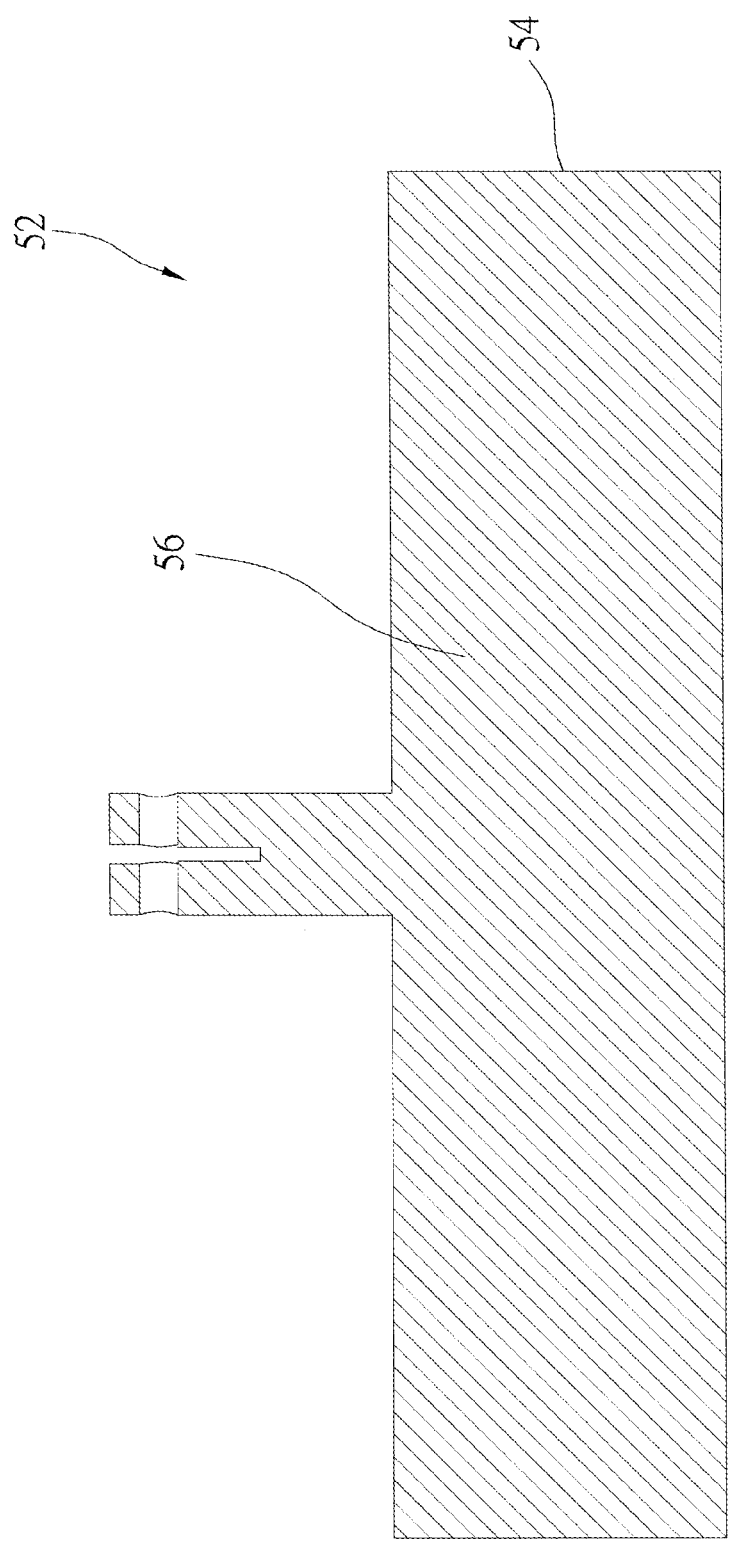
FIG. 5 is a sectional view of the thermal insulation cover of a fourth preferred embodiment of the present invention.

A thermal insulation cover 52 of the fourth preferred embodiment of the present invention is shown in FIG. 5, of which the difference from the aforementioned preferred embodiments is that a main body 54 and an insulating member 56 of the thermal insulation cover 52 are integrally made of graphite, wherein the outer portion is defined as the main body 54, and the inner portion is defined as the insulating member 56. In other words, the thermal insulation cover 52 can also provide the same function of blocking heat conduction and heat convection by thickening the graphite material.

Under the same condition of completely melting the material in the crucible 12 within a predetermined time, power consumed by crystal growth apparatuses applied with different thermal insulation covers of the aforementioned preferred embodiments is listed in Table 1 below. As shown in Table 1, the thermal insulation covers provided in the present invention are indeed capable of reducing consumed power.

TABLE 1

| Type of thermal insulation covers | Consumed power (unit: kW) | Percentage of reduced power (unit: %) |
|---|---|---|
| No thermal insulation cover applied | 88.35 | — |
| The thermal insulation cover of the first preferred embodiment | 76.61 | 13.29 |
| The thermal insulation cover of the third preferred embodiment | 77.40 | 12.39 |
| The thermal insulation cover of the fourth preferred embodiment | 79.15 | 10.41 |

In summary, by moving the thermal insulation covers provided in the present invention into the passage of the shield of the crystal growth apparatus during the process of heating and melting the material, thermal energy in the crucible can be effectively prevented from escaping due to heat conduction and heat convection are blocked in this way. As a result, time required for completely melting the material in the crucible is shortened, and power consumed by the heating device is reduced as well.

It must be pointed out that the embodiments described above are only some preferred embodiments of the present invention. All equivalent structures which employ the concepts disclosed in this specification and the appended claims should fall within the scope of the present invention.

What is claimed is:

1. A thermal insulation cover for a crystal growth apparatus, wherein the crystal growth apparatus comprises a crucible for holding a material to be melted; comprising:
a main body having a bottom surface facing an inner bottom of the crucible; and
an insulating member provided on the main body at a location opposite to the bottom surface of the main body, and within an orthographic range of the bottom surface;
wherein the thermal insulation cover further comprises at least one passage passing through the main body and the insulating member, wherein the passage communicates with spaces above and below the thermal insulation cover;

wherein the thermal insulation cover is connected to a lower end of a wire, and the wire is adapted to control the thermal insulation cover;

the whole thermal insulation cover is adapted to be provided above the material to be melted, and moves upwardly to leave the crucible after the material in the crucible is melted into a liquid, and then a process of crystal growth proceeds;

wherein the thermal insulation cover includes a connector engaged with the main body, and the thermal insulation cover is connected to the wire with the connector;

wherein the wire and the connector extend along a central axis of the thermal insulation cover.

2. The thermal insulation cover of claim 1, wherein the main body comprises a top plate and a base; the base has a chamber and a top opening communicating with the chamber; the top plate is engaged with the base to seal the top opening.

3. The thermal insulation cover of claim 2, further comprising a protective layer covering an outer circumferential surface of the base, wherein the protective layer is harder than the main body.

4. A crystal growth apparatus, comprising:
a crucible for holding a material to be melted;
a thermal insulation cover comprising a main body and an insulating member, wherein the main body has a bottom surface facing an inner bottom of the crucible; the insulating member is provided on the main body at a location opposite to the bottom surface of the main body, and is within an orthographic range of the bottom surface;
a driving device capable of moving the thermal insulation cover towards or away from the crucible; and
a heating device for heating the crucible;
wherein the whole thermal insulation cover is provided above the material to be melted, and is connected to the driving device via a wire;
wherein the thermal insulation cover further comprises at least one passage passing through the main body and the insulating member; the passage communicates with spaces above and below the thermal insulation cover;
wherein after the material in the crucible is melted into a liquid, the driving device is controlled to move the thermal insulation cover upwardly to leave the crucible, and then a process of crystal growth proceeds;
wherein the thermal insulation cover includes a connector engaged with the main body, and the thermal insulation cover is connected to the wire with the connector;
wherein the wire and the connector extend along a central axis of the thermal insulation cover.

5. The crystal growth apparatus of claim 4, wherein the main body of the thermal insulation cover has a chamber, and the insulating member is provided in the chamber.

6. The crystal growth apparatus of claim 5, wherein the main body of the thermal insulation cover comprises a top plate and a base; the base has the chamber and a top opening communicating with the chamber; the top plate is engaged with the base to seal the top opening, the connector passes through the top plate and is engaged with the base.

7. The crystal growth apparatus of claim 5, wherein the thermal insulation cover comprises a protective layer covering an outer circumferential surface of the main body; the protective layer is harder than the main body.

* * * * *